US00RE44040E

(19) United States
(12) Reissued Patent
Fukui

(10) Patent Number: US RE44,040 E
(45) Date of Reissued Patent: Mar. 5, 2013

(54) PLASMA DISPLAY DEVICE CAPABLE OF REDUCING UNWANTED RADIANT NOISES

(75) Inventor: Yasuhito Fukui, Kadoma (JP)

(73) Assignee: Panasonic Corporation, Osaka (JP)

(21) Appl. No.: 13/295,290

(22) Filed: Nov. 14, 2011

Related U.S. Patent Documents

Reissue of:

(64) Patent No.: 7,898,506
Issued: Mar. 1, 2011
Appl. No.: 10/569,384
PCT Filed: Aug. 26, 2004
PCT No.: PCT/JP2004/012701
§ 371 (c)(1),
(2), (4) Date: Feb. 24, 2006
PCT Pub. No.: WO2005/022493
PCT Pub. Date: Mar. 10, 2005

(30) Foreign Application Priority Data

Aug. 29, 2003 (JP) ..... 2003-306623

(51) Int. Cl.

| | |
|---|---|
| ***G09G 3/28*** | (2006.01) |
| ***H05K 9/00*** | (2006.01) |
| ***H05K 5/00*** | (2006.01) |
| ***H05K 5/02*** | (2006.01) |
| ***H01J 17/49*** | (2006.01) |

(52) U.S. Cl. ..... 345/60; 361/816; 361/753; 313/582; 174/51

(58) Field of Classification Search ..... 345/60–72, 345/37; 313/581–587, 590, 46; 315/169.4; 348/797; 361/142, 614, 679.02, 681, 753, 361/796, 799, 800, 807, 816, 818; 248/157, 248/917; 174/51, 350–377
See application file for complete search history.

(56) References Cited

U.S. PATENT DOCUMENTS

| | | | |
|---|---|---|---|
| 6,157,546 | A | 12/2000 | Petty et al. |
| 6,180,876 | B1 | 1/2001 | Holmes |
| 6,271,465 | B1 | 8/2001 | Lacey |
| 6,359,390 | B1 | 3/2002 | Nagai |
| 6,426,881 | B1 | 7/2002 | Kurz |
| 6,534,722 | B2 | 3/2003 | Takaoka |
| 6,781,851 | B2 | 8/2004 | Daoud et al. |
| 6,813,159 | B2 | 11/2004 | Irie et al. |
| 2004/0036396 | A1 | 2/2004 | Kang et al. |
| 2004/0041918 | A1 | 3/2004 | Chan et al. |

FOREIGN PATENT DOCUMENTS

| | | |
|---|---|---|
| JP | 10-117081 | 5/1998 |
| JP | 11-38893 | 2/1999 |
| JP | 11-143373 | 5/1999 |
| JP | 2000-340991 | 12/2000 |

*Primary Examiner* — Alexander Eisen
*Assistant Examiner* — Keith Crawley
(74) *Attorney, Agent, or Firm* — Wenderoth, Lind & Ponack, L.L.P.

(57) ABSTRACT

A plasma display device includes a plasma display, a chassis having conductivity that supports the plasma display, a tuner circuit, a scan driver, a sustaining driver and so forth used to display a video on the plasma display, a back cover that covers the chassis, the scan driver, the sustaining driver, etc., and a shield body that covers the tuner circuit. The shield body is electrically connected to the chassis and to the back cover.

14 Claims, 6 Drawing Sheets

PLASMA DISPLAY DEVICE CAPABLE OF REDUCING UNWANTED RADIANT NOISES

Matter enclosed in heavy brackets [ ] appears in the original patent but forms no part of this reissue specification; matter printed in italics indicates the additions made by reissue.

TECHNICAL FIELD

The present invention relates to a plasma display device using a plasma display driven at a high voltage.

BACKGROUND ART

A plasma display device in the related art using a plasma display (hereinafter, abbreviated as PDP) is disclosed, for example, in JP-A-10-117081. A driving circuit to drive the PDP and a power supply circuit to supply various voltages to the circuit and the like are attached to the back surface of the PDP. A conductor that covers the PDP entirely, a conductor that covers the driving circuit, and a conductor that covers the power supply circuit are provided separately to shield the PDP electromagnetically.

The PDP, the driving circuit, and the power supply circuit are shielded separately by the shield structure as described above. It is thus possible to prevent unwanted radiant noises generated from the PDP from reaching the driving circuit to be superimposed on a signal of the driving circuit. Noises of a display screen can be therefore reduced.

When the PDP, the driving circuit, and the power supply circuit are shielded separately as described above, however, the shield structure becomes complicated. Hence, the number of parts of shield components is increased and so is the number of manufacturing steps to attach the shield components. The cost of the plasma display device is thus increased.

In addition, a tuner-integrated plasma display device, in which a tuner circuit to receive a broadcast signal together with the driving circuit is provided inside, has been developed in recent years. In this case, an unwanted current leaking from the driving circuit or the like flows into the conductor covering the PDP and induces unwanted radiation. This makes it easier for unwanted radiant noises to be superimposed on a signal of an analog circuit handling an analog signal, in particular, the tuner circuit. As a result, noises occurring in a display image or peripheral equipment are adversely affected.

SUMMARY OF THE INVENTION

An object of the invention therefore relates to a plasma display device not only capable of reducing unwanted radiant noises released to the outside from the plasma display device, but also capable of reducing adverse influences of unwanted radiant noises to the internal circuits by using a simple configuration.

A plasma display device according to one aspect of the invention includes: a plasma display; a supporting member having conductivity that supports the plasma display; an electric circuit used to display a video on the plasma display; a first conducting member that covers at least part of the supporting member and the electric circuit; and a second conducting member that covers part of the electric circuit, wherein the second conducting member is electrically connected to the supporting member and to the first conducting member.

In this plasma display device, unwanted radiant noises generated from the plasma display and the electric circuit are shielded by the first conducting member. It is thus possible to reduce unwanted radiant noises released to the outside. Also, because the first conducting member is electrically connected to the second conducting member while the second conducting member is electrically connected to the supporting member, even when an unwanted current leaks from the driving circuit or the like included in the electrical circuit, the unwanted current flows sequentially in order of the first conducting member, the second conducting member, and the supporting member. Hence, not only is it possible to inhibit unwanted radiant noises induced by the unwanted current from being released to the outside, but it is also possible to inhibit the unwanted current from flowing into the circuit covered with the second conducting member so that adverse influences of the unwanted current to the circuit can be reduced. Further, because the circuit covered with the second conducting member is shielded by the second conducting member, adverse influences of the unwanted radiant noises to the circuit can be also reduced. Hence, not only is it possible to reduce unwanted radiant noises released to the outside from the plasma display device, but it is also possible to reduce adverse influences of the unwanted radiant noises to the internal circuits by a configuration as simple as using the first and second conducting members.

It is preferable that the electric circuit includes a digital circuit that chiefly processes a digital signal and an analog circuit that chiefly processes an analog signal, and that the first conducting member covers the supporting member and the digital circuit and the second conducting member covers the analog circuit.

In this case, because the analog circuit that is susceptible to the unwanted radiant noises is shielded sufficiently by the second conducting member, even when an unwanted current leaks from the digital circuit, it is possible to reduce adverse influences of the unwanted irradiation noises to the analog circuit sufficiently.

It is preferable that the electric circuit includes a driving circuit that drives the plasma display and a receiving circuit that receives a broadcast signal, and that the first conducting member covers the supporting member and the driving circuit and the second conducting member covers the receiving circuit.

In this case, because the receiving circuit that is susceptible to the unwanted radiant noises is shielded sufficiently by the second conducting member, even when an unwanted current leaks from the driving circuit, it is possible to reduce adverse influences of the unwanted irradiation noises to the receiving circuit sufficiently.

It is preferable that the driving circuit includes: a data electrode driving circuit that drives data electrodes of the plasma display; a scanning electrode driving circuit that drives scanning electrodes of the plasma display; and a sustaining electrode driving circuit that drives sustaining electrodes of the plasma display, and that the data electrode driving circuit, the scanning electrode driving circuit, and the sustaining electrode driving circuit are disposed in an outer peripheral portion of the supporting member and the receiving circuit is disposed near a center of the supporting member.

In this case, an unwanted current leaking from the data electrode driving circuit, the scanning electrode driving circuit, and the sustaining electrode driving circuit flows sequentially in order of the first conducting member, the second conducting member, and the supporting member, while the receiving circuit is shielded sufficiently by the second conducting member. Hence, not only is it possible to inhibit unwanted radiant noises induced by the unwanted current from being released to the outside, but it is also possible to reduce adverse influences of the unwanted radiant noises to the receiving circuit that is susceptible to unwanted radiation.

It is preferable that the supporting member is connected to ground potential of the electric circuit.

In this case, an unwanted current leaking from the driving circuit or the like included in the electric circuit flows sequentially in order of the first conducting member, the second conducting member, and the supporting member, and is consequently grounded by being flown back to the supporting member. Hence, not only is it possible to prevent unwanted radiant noises induced by the unwanted current from being released to the outside, but it is also possible to prevent the unwanted current from flowing into the circuit covered with the second conducting member.

It is preferable that the second conducting member is provided with a first joint portion used when joined to the first conducting member, and a second joint portion used when joined to the supporting member.

In this case, it is possible to connect the first and second conducting members electrically and mechanically in a reliable manner with the use of the joint portions.

It is preferable that the second conducting member is fixed to the first conducting member through screw fixation via the first joint portion, and to the supporting member through screw fixation via the second joint portion.

In this case, it is possible to firmly connect the first and second conducting members electrically and mechanically through screw fixation.

It is preferable that the first conducting member is provided with an opening, and part of the second conducting member is exposed through the opening.

In this case, the second conducting member can be removed via the opening without having to remove the first conducting member, and the internal circuit of the second conducting member can be adjusted via the opening. It is thus possible to improve ease of maintenance of the internal circuit of the second conducting member.

It is preferable that the second conducting member includes a first shield member connected to the supporting member, and a second shield member formed to be attachable to/detachable from the first shield member.

In this case, the internal circuit of the second conducting member can be adjusted by removing the second shield member while the first shield member is connected to the supporting member. It is thus possible to further improve ease of maintenance of the internal circuit of the second conducting member.

It is preferable that the second conducting member is formed to be removable from the supporting member and the first conducting member via the opening.

In this case, the second conducting member can be removed via the opening without having to remove the first conducting member. The second conducting member and the internal circuits can be therefore readily replaced.

It is preferable that the second conducting member includes a first shield member allowed to be inserted in an interior of the first conducting member via the opening, and a second shield member formed to be attachable to/detachable from the first shield member.

In this case, the internal circuit of the second conducing member can be adjusted by removing the second shield member while the first shield member is fixed to the supporting member without having to remove the first conducting member. It is thus possible to further improve ease of maintenance of the internal circuit of the second conducting member.

It is preferable that the second conducting member is provided with a slit along a direction in which an unwanted current flows.

In this case, because the slit is formed along the direction in which the unwanted current flows, the unwanted current leaking from the driving circuit or the like included in the electric circuit is allowed to flow from the second conducting member to the supporting member in a reliable manner. It is thus possible to prevent unwanted radiant noises induced by the unwanted current.

It is preferable that: the electric circuit includes first and second driving circuits that drive the plasma display, and a receiving circuit that is disposed between the first and second driving circuits and receives a broadcast signal; the first conducting member covers the supporting member and the first and second driving circuits; and the second conducting member includes a first shield plate disposed between the first driving circuit and the receiving circuit, a second shield plate disposed between the second driving circuit and the receiving circuit, a third shield plate disposed between one end of the first shield plate and one end of the second shield plate, and a fourth shield plate disposed between the other end of the first shield plate and the other end of the second shield plate, at least one of the third and fourth shield plates being provided with a slit near an end portion.

In this case, because at least one of the third and fourth shield plates is provided with a slit near the end portion, an unwanted current leaking from the first and second driving circuits flows sequentially in order of the first conducting member, the first and second shield plates of the second conducting member, and the supporting member in a reliable manner. It is thus possible to prevent unwanted radiant noises induced by the unwanted current in a reliable manner. Also, because the receiving circuit is shielded sufficiently by the first through fourth shield plates of the second conducting member, it is possible to prevent adverse influences of the unwanted radiant noises to the receiving circuit in a reliable manner.

It is preferable that the first driving circuit includes a scanning electrode driving circuit that drives scanning electrodes of the plasma display, and the second driving circuit includes a sustaining electrode driving circuit that drives sustaining electrodes of the plasma display.

In this case, an unwanted current leaking from the scanning electrode driving circuit and the sustaining electrode driving circuit driven at a high voltage flows sequentially in order of the first conducting member, the first and second shield plates of the second conducting member, and the supporting member in a reliable manner. It is thus possible to prevent unwanted radiant noises induced by the unwanted current in a reliable manner. Also, because the receiving circuit is shielded sufficiently by the first through fourth shield plates of the second conducting member, it is possible to prevent adverse influences of the unwanted radiant noises to the receiving circuit.

DETAILED DESCRIPTION OF THE INVENTION

Figure 1:
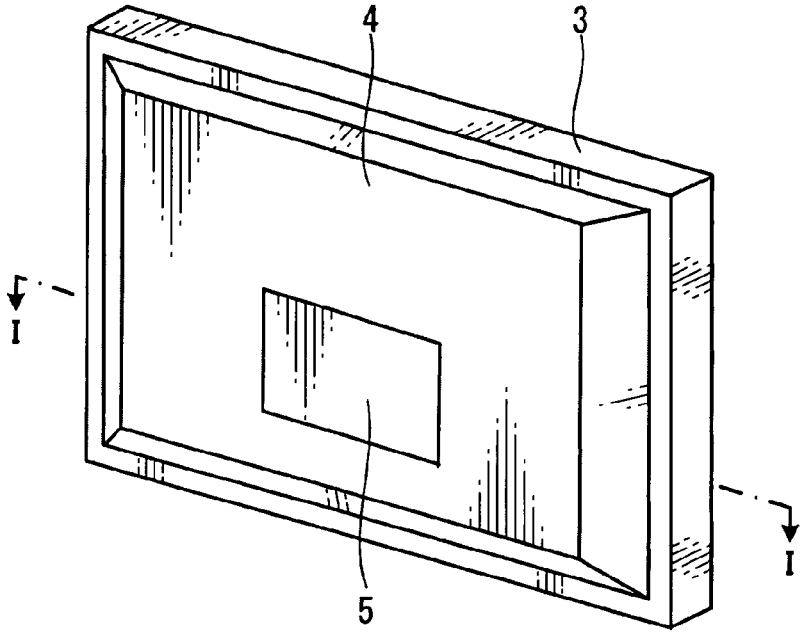
FIG. 1 is a perspective view showing a back surface of a plasma display device according to a first embodiment of the invention.
Figure 2:
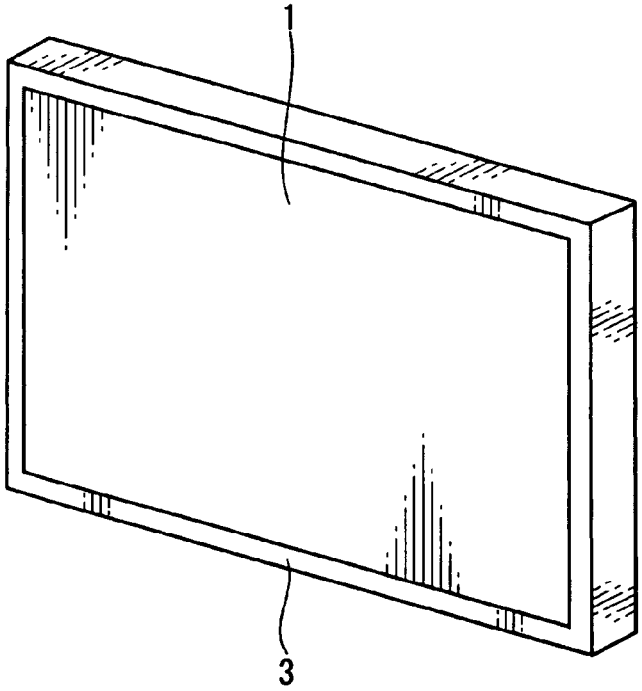
FIG. 2 is a perspective view showing a front surface of the plasma display device according to the first embodiment of the invention.
Figure 3:
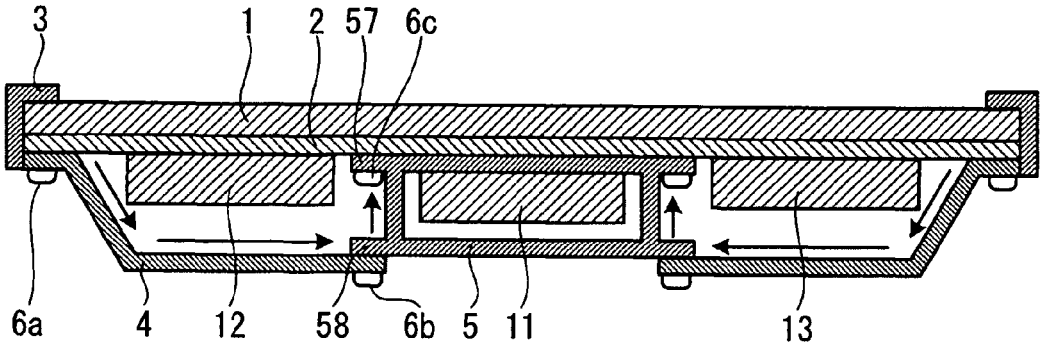
FIG. 3 is a cross section showing the configuration of the plasma display device according to the first embodiment of the invention.

Hereinafter, a plasma display device of the invention will be described. FIG. 1 is a perspective view showing a back surface of a plasma display device according to a first embodiment of the invention. FIG. 2 is a perspective view showing a front surface of the device. FIG. 3 is a cross section showing the configuration of the device and it is a cross section taken along the line I-I of FIG. 1.

The plasma display device shown in FIG. 1 through FIG. 3 includes a plasma display panel (hereinafter, abbreviated as PDP) 1, a chassis 2, a front cover 3, a back cover 4, a shield body 5, fixing screws 6a through 6c, a tuner circuit 11, a scan driver 12, and a sustaining driver 13.

The PDP 1 is of a rectangular shape, and fixed to the front surface of the chassis 2. The PDP 1 includes a front surface substrate and a back surface substrate, both of which are made of glass, and plural data electrodes arrayed in the vertical direction of the screen and plural scanning electrodes and plural sustaining electrodes arrayed in the horizontal direction of the screen are interposed between these substrates. A discharging cell is formed at each intersection of the respective electrodes, and the PDP 1 displays various screens by discharging the discharging cells.

The chassis 2 is made of metal having conductivity, and it is formed of, for example, an aluminum die-cast component of an almost rectangular shape provided with fixing ribs or the like in an appropriate manner to serve as a supporting member that supports the PDP 1 or the like. The chassis 2 is grounded as it is connected to the ground potential of electric circuits, such as the scan driver 12 and the sustaining driver 13.

The front cover 3 is fixed to the chassis 2 using fixing means (not shown), such as screw fixation, so as to cover the edge portion while leaving the display screen of the PDP 1. The front cover 3 comprises a metal body having conductivity, an electroplated molded article, or the like.

The scan driver 12 and the sustaining driver 13 are fixed to the back surface of the chassis 2 on the left and on the right, respectively. The tuner circuit 11 is fixed inside the shield body 5. The shield body 5 is fixed through screw fixation at the center bottom of the back surface of the chassis 2 using the screws 6c. The back cover 4 is fixed to the chassis 2 through screw fixation using the screws 6a, and is also fixed to the shield body 5 through screw fixation using the screws 6b.

Figure 4:
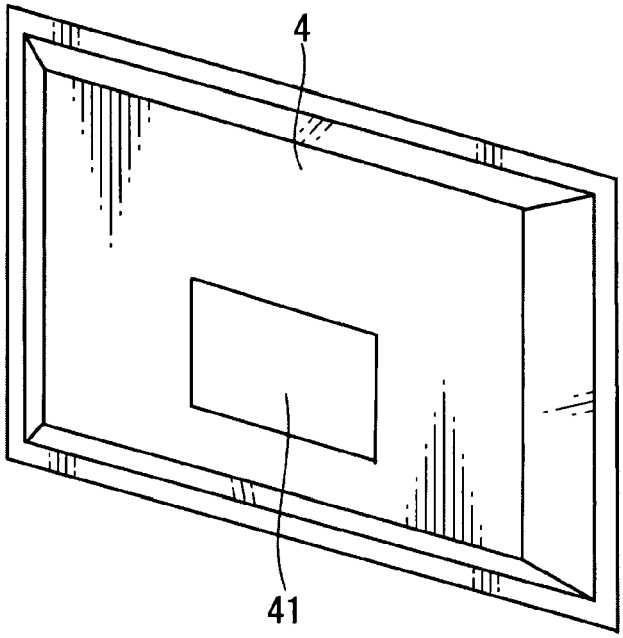
FIG. 4 is a perspective view of a back cover shown in FIG. 1 through FIG. 3.

FIG. 4 is a perspective view showing the back cover 4 shown in FIG. 1 through FIG. 3. As is shown in FIG. 4, the back cover 4 has a convex portion comprising taper surfaces on the four sides, and the scan driver 12, the sustaining driver 13 and the like are disposed in a space defined by this convex portion. The back cover 4 comprises a metal body having conductivity, an electroplated molded article, or the like, and servers as a first conducting member that covers the chassis 2, the scan driver 12, the sustaining driver 13, etc. As has been described, because the back cover 4 serving as the first conductive member covers the chassis 2 serving as the supporting member as well as the scan driver 12, the sustaining driver 13, and the like as part of the electric circuits, the first conducting member covers the supporting member and part of the electric circuits.

A hole 41 of a rectangular shape that servers as an opening is provided to the back cover 4 at the center bottom, and holes for the fixing screws 6b to be inserted are formed at specific positions in the edge portion of the hole 41. The back surface of the shield body 5 is exposed through the hole 41. The back surface of the shield body 5 thus exerts a shielding function and is also used as an exterior surface.

As has been described, because the back surface of the shield body 5 is exposed through the hole 41, when the shield body 5 or a part of which is formed removably via the hole 41, a maintenance work of the shield body 5 or the tuner circuit 11 provided inside or the like can be performed via the hole 41.

The position, the number, and the shape of the hole are not limited to the examples described above, and various modifications are possible. The hole may be omitted to improve the shield effect by the back cover 4, or two or more holes may be provided. As has been described, the hole 41 may not be provided to the back cover 4, so that the back cover 4 covers the chassis 2 and all the electric circuits including the tuner circuit 11. In this case, the first conducting member covers the supporting member and all the electric circuits.

Figure 5:
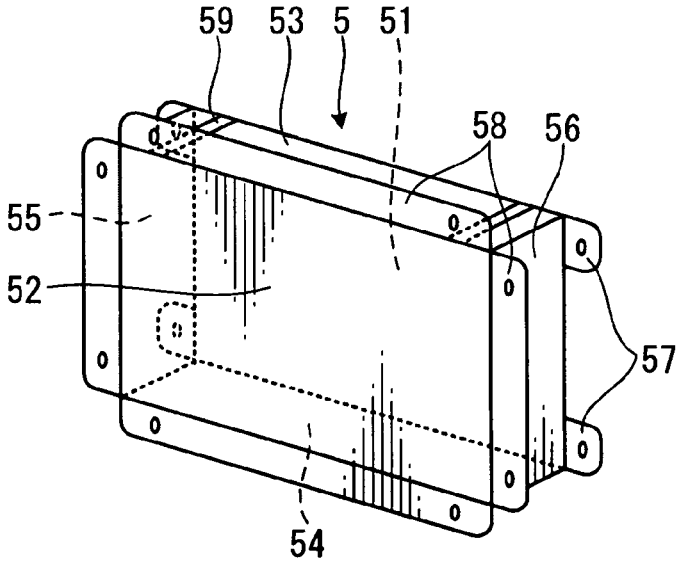
FIG. 5 is a perspective view of a shield body shown in FIG. 1 through FIG. 3.

FIG. 5 is a perspective view of the shield body 5 shown in FIG. 1 through FIG. 3. The shield body 5 comprises a metal body having conductivity, an electroplated molded article, or the like, and servers as a second conducting member that covers the tuner circuit 11. As has been described, because the shield body 5 serving as the second conducting member covers the tuner circuit 11 as part of the electric circuits, the second conducting member covers part of the electric circuits.

As is shown in FIG. 5, the shield body 5 is substantially in the form of a rectangular prism, and comprises shield members on six surfaces, including a front surface shield plate 51 (the surface on the chassis 2 side), a back surface shield plate 52 (the surface exposed through the hole 41), a top surface shield plate 53, a bottom surface shield plate 54, a left side-surface shield plate 55, and a right side-surface shield plate 56. The tuner circuit 11 is accommodated inside the shield body 5.

The left side-surface shield plate 55 is disposed between the scan driver 12 and the tuner circuit 11. The right side-surface shield plate 56 is disposed between the sustaining driver 13 and the tuner circuit 11. The top surface shield plate 53 is disposed between the top end of the left side-surface shield plate 55 and the top end of the right side-surface shield plate 56. The bottom surface shield 54 is disposed between the bottom end of the left side-surface shield plate 55 and the bottom end of the right side-surface shield plate 56. The front surface shield plate 51 and the back surface shield plate 52 are disposed at positions to form a rectangular prism together with the left side-surface shield plate 55, the top surface shield plate 53, the right side-surface shield plate 56, and the bottom surface shield plate 54.

Four joint pieces 57 that extend along the front surface shield plate 51 are provided integrally with the front surface shield plate 51. Holes are provided to the both end portions of the respective joint pieces 57 for the fixing screws 6c to be inserted. The joint pieces 57 serve as a first joint portion used to join the shield body 5 and the chassis 2 together.

A joint piece 58 that extends along the back surface shield plate 52 is provided integrally with the back surface shield plate 52 on each side. Each joint piece 58 is provided with a screw hole into which the fixing screw 6b is threaded. The joint pieces 58 serve as a second joint portion used to join the shield body 5 and the back cover 4 together.

The shape of the shield body is not particularly limited to the example as described above. A concave portion, a convex portion, a notch, a hole, etc. may be provided appropriately to the rectangular prism. The shape and the number of the joint pieces are not particularly limited to the examples as described above, either. As long as the shield body can be connected to the chassis and to the back cover electrically and mechanically, various modifications are possible. For example, connection sides may be provided to all the sides of the front surface and/or the back surface of the shield body, or joint sides may be provided to the left side-surface, the top surface, the right side-surface, and the bottom surface of the shield body. Further, part of the front surface or the back surface of the shield body or the like may be used also as joint pieces without providing joint pieces protruding to the outside.

Slits 59 are formed near the both end portions of the top surface shield plate 53 by strip-shaped notches. The slits 59 are formed along a direction in which flows an unwanted current leaking from the scan deriver 12, the sustaining driver 13, etc., that is, along a direction perpendicular to the chassis 2. An unwanted current flowing into one side of the slit 59 will not flow into the other side, so that the unwanted current is flown back to the chassis 2 in the shortest distance.

The shape, the formed position, and the number of the slits are not particularly limited to the examples as described above, and various modifications are possible. For example, the slits may be formed in the bottom surface, at the joint position of the left side-surface and the top surface and/or the joint position of the right side-surface and the top surface, or one or three or more slits may be provided.

Figure 6:
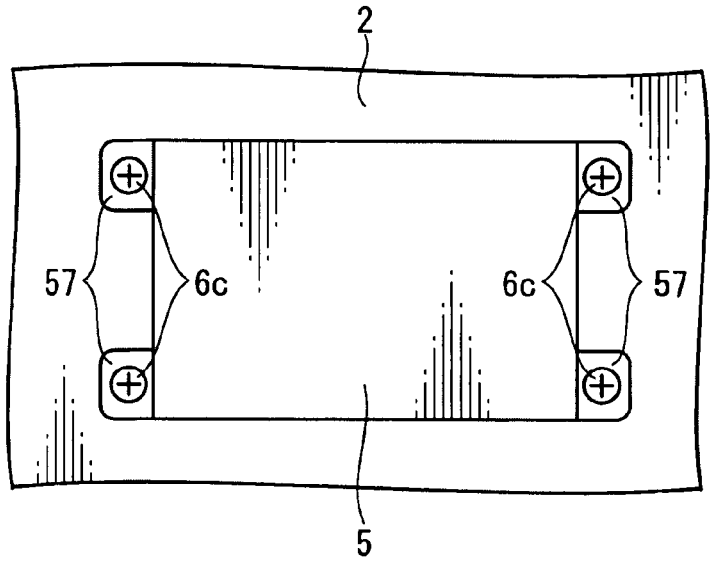
FIG. 6 is a plan view showing a state where the shield body shown in FIG. 5 is attached to a chassis.

FIG. 6 is a plan view showing a state where the shield body 5 shown in FIG. 5 is attached to the chassis 2. The joint pieces 58 are omitted in FIG. 6 to show the attachment state clearly. After the tuner circuit 11 is attached to the interior, the shield body 5 is connected to the chassis 2 electrically and mechanically via the joint pieces 57 through screw fixation by which the fixing screws 6c are threaded into the screw holes made in the chassis 2.

Figure 7:
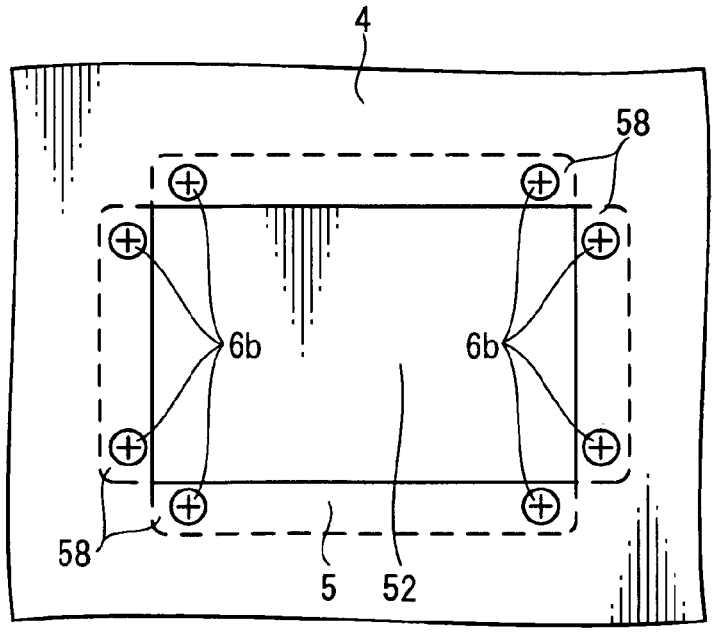
FIG. 7 is a plan view showing a state where the shield body shown in FIG. 5 is attached to the back cover.

FIG. 7 is a plan view showing a state where the shield body 5 shown in FIG. 5 is attached to the back cover 4. After the back cover 4 is fixed to the chassis 2, the shield body 5 is connected to the back cover 4 electrically and mechanically via the joint pieces 58 through screw fixation by which the fixing screws 6b are threaded into the screw holes made in the joint pieces 58. In this instance, the back surface shield plate 52 is exposed through the hole 41 (see FIG. 4).

The method of connecting the shield body 5 to the chassis 2 and to the back cover 4 is not particularly limited to the examples as described above, and various modifications are possible. For example, the shield body 5 may be attached firmly to the chassis 2 and to the back cover 4 by welding the shield body 5 to the chassis 2 and to the back cover 4 at specific portions, by fitting the shield body 5 into the chassis 2 and into the back cover 4 at specific portions, etc.

Figure 8:
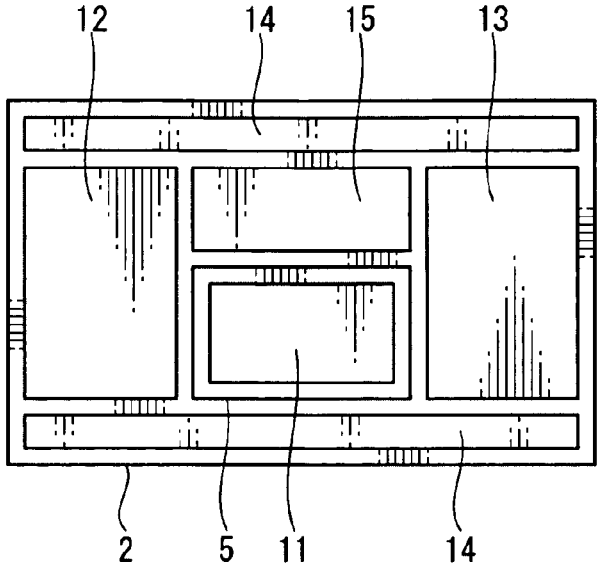
FIG. 8 is a view showing locations of respective circuits used in the plasma display device shown in FIG. 1 through FIG. 3 on the chassis.

FIG. 8 is a view showing locations of the respective circuits used in the plasma display device shown in FIG. 1 through FIG. 3 on the chassis 2. As is shown in FIG. 8, on the back surface of the chassis 2, one part of an address driver 14 serving as a data electrode driving circuit that drives data electrodes of the PDP 1 is placed on the upper side and the other part is placed on the lower side, while the scan deriver 12 serving as a scanning electrode driving circuit that drives scanning electrodes of the PDP 1 is fixed on the left side and the sustaining driver 13 serving as a sustaining electrode driving circuit that drives the sustaining electrodes of the PDP 1 is fixed to the right side.

A signal processing circuit 15 is a circuit that applies various kinds of signal processing, such as scanning number conversion processing, adaptive luminance enhancement processing, and sub-field conversion processing, to a video signal received from the tuner circuit 11, and is disposed at the top between the scan driver 12 and the sustaining driver 13. The tuner circuit 11 is a receiving circuit that receives a broadcast signal, and is disposed at the bottom between the scan deriver 12 and the sustaining driver 13.

Of these circuits, the scan driver 12, the sustaining driver 13, the address driver 14, and the signal processing circuit 15 are digital circuits that chiefly process a digital signal, and the back cover 4 covers and shields these circuits. Meanwhile, the tuner circuit 11 is an analog circuit that chiefly processes an analog signal, and the shield body 5 covers and shields the tuner circuit 11. In this case, the tuner circuit 11 that chiefly processes an analog signal is more susceptible to unwanted radiation than the other circuits. However, as will be described below, the tuner circuit 11 is sufficiently shielded by the back cover 4, the chassis 2, and the shield body 5.

Although the power supply circuit and the like are omitted in FIG. 8, the power supply circuit and the like are also located appropriately on the back surface of the chassis 2 in regions other than the region where the tuner circuit 11 is located. The configurations and the locations of the respective circuits are not particularly limited to the examples as described above, and various modifications are possible. For example, one address driver may be disposed at the top or bottom of the chassis 2.

The shielding function of the plasma display device configured as described above will now be described in detail. Because the plasma display device drives the PDP 1 at a high voltage, unwanted radiant noises are generated first from the PDP 1, the scan driver 12, the sustaining driver 13, the address driver 14, and the signal processing circuit 15, and the unwanted radiant noises are shielded by the back cover 4. It is thus possible to prevent radiation of the unwanted radiant noises to the outside of the device.

Also, an unwanted current starts to leak to the back cover 4 from the driving circuit that drives the PDP 1 at a high voltage. In particular, an unwanted current readily leaks from the scan driver 12 and the sustaining driver 13 driven at a high driving voltage. In this embodiment, because the back cover 4 is electrically connected to the shield body 5 via the joint pieces 58, the shield body 5 is electrically connected to the chassis 2 via the joint pieces 57, and the chassis 2 is grounded, as is indicated by an arrow in FIG. 3, the unwanted current leaking to the back cover 4 flows to the shield body 5 via the back cover 4, and the unwanted current flowing through the shield body 5 is flown back to the chassis 2 that is grounded.

In this manner, the shield body 5 functions as a bypass route between the back cover 4 and the chassis 2, and the route can be shortened. It is thus possible to ground the unwanted current in a reliable manner, which can in turn reduce a quantity of generated unwanted radiant noises. In addition, because it is possible to prevent the unwanted current from flowing into the inside of the shield body 5, that is, the tuner circuit 11, adverse influences of the unwanted current to the tuner circuit 11 can be reduced. Further, because the tuner circuit 11 is shielded by the shield body 5, adverse influences of the unwanted radiant noises to the tuner circuit 11 can be reduced.

Consequently, in this embodiment, not only it is possible to reduce unwanted radiant noises released to the outside from the PDP 1 and the like, but it is also possible to prevent adverse influences to the tuner circuit 11 by using a configuration as simple as using the back cover 4 and the shield body 5 as shield means.

Also, in this embodiment, because the slits 59 are formed in the top surface of the shield body 5, when an unwanted current leaks from the back cover 4 to the shield body 5, the unwanted current can be flown back to the chassis 2 in the shortest route. Hence, not only is it possible to prevent unwanted radiant noises induced by the unwanted current in a reliable manner, but it is also possible to prevent adverse influences of the unwanted current to the tuner circuit 11 in a reliable manner.

Figure 9:
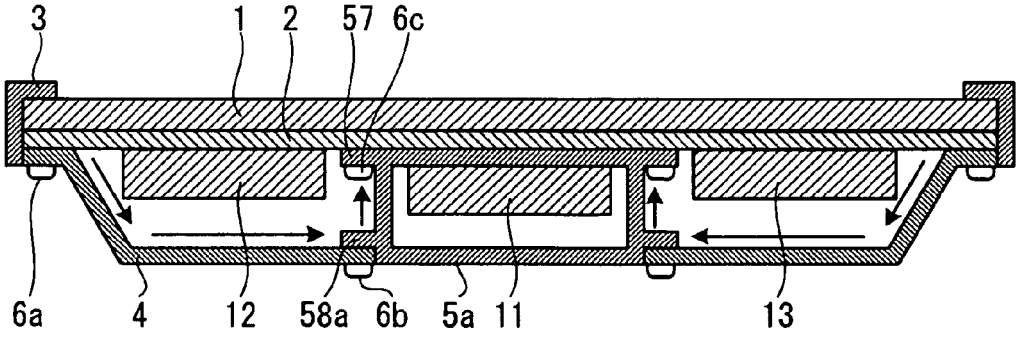
FIG. 9 is a cross section showing the configuration of a plasma display device according to a second embodiment of the invention.

A plasma display device according to a second embodiment of the invention will now be described. FIG. 9 is a cross section showing the configuration of the plasma display device according to the second embodiment of the invention. The plasma display device shown in FIG. 9 is different from the plasma display device shown in FIG. 1 through FIG. 3 in that the shield body 5 is replaced by a shield body 5a, and the rest is the same as the plasma display device shown in FIG. 1 through FIG. 3. Hence, like components are labeled with like reference numerals and descriptions of these components are omitted.

The shield body 5a shown in FIG. 9 comprises a metal body having conductivity, an electroplated molded article, or the like, and servers as a second conducting member that covers the tuner circuit 11. Joint pieces 58a of the shield body 5a are provided integrally with the respective side surfaces of the shield body 5a, including a left side-surface shield plate, a top surface shield plate, a right side-surface shield plate, and a bottom surface shield plate. The back surface shield plate of the shield body 5a is flush with the back surface of the back cover 4.

In this embodiment, the same effects as the first embodiment can be achieved; moreover, because the back surface shield plate of the shield body 5a that functions also as the exterior component is flush with the back surface of the back cover 4, unwanted irregularities on the back surface are eliminated and the outer appearance of the plasma display device can achieve a feeling of unity.

Figure 10:
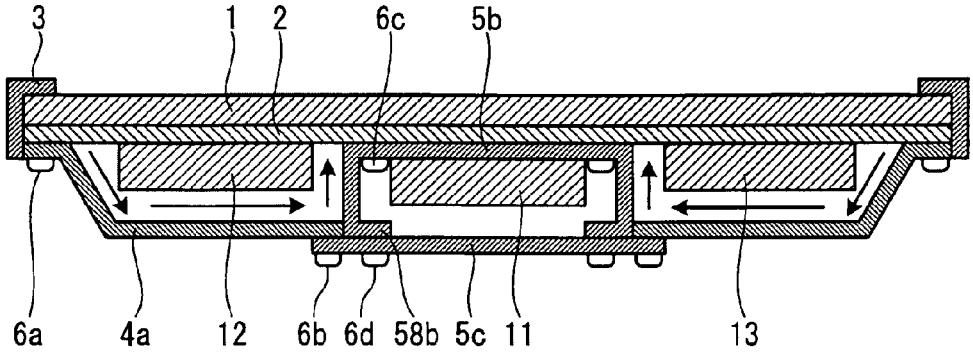
FIG. 10 is a cross section showing the configuration of a plasma display device according to a third embodiment of the invention.

A plasma display device according to a third embodiment of the invention will now be described. FIG. 10 is a cross section showing the configuration of the plasma display device according to the third embodiment of the invention. The plasma display device shown in FIG. 10 is different from the plasma display device shown in FIG. 1 through FIG. 3 in that the shield body 5 and the back cover 4 are replaced by a first shield body 5b and a second shield body 5c and a back cover 4a, respectively, and the rest is the same as the plasma display device shown in FIG. 1 through FIG. 3. Hence, like components are labeled with like numerals and descriptions of such components are omitted.

Each of the first shield body 5b and the second shield body 5c shown in FIG. 10 comprises a metal body having conductivity, an electroplated molded article, or the like, and they serve as a second conducting member that covers the tuner circuit 11.

The first shield body 5b is formed of five surfaces, including a front surface shield plate (the surface on the chassis 2 side), a top surface shield plate, a bottom surface shield plate, a left side-surface shield plate, and a right side-surface shield plate, and it is substantially in the form of a rectangular prism provided with an opening. The second shield body 5c is formed of a back surface shield plate (the surface that is exposed) covering the opening, and is formed removably with respect to the back cover 4a and the first shield body 5b.

The front surface shield plate of the first shield body 5b is provided with holes for fixing screws to be inserted, and the front surface shield plate of the first shield body 5b functions also as a joint portion. After the tuner circuit 11 is attached to the interior, the first shield body 5b is connected to the chassis 2 electrically and mechanically through screw fixation by which the fixing screws 6c are threaded into the screw holes made in the chassis 2.

Connection pieces 58b that extend inward are formed integrally with the top surface shield plate, the bottom surface shield plate, the left side-surface shield plate, and the right side-shield plate of the first shield body 5b, and screw holes used for screw fixation of fixing screws 6d are made in the respective joint pieces 58b. The back cover 4a is provided with a rectangular hole for the first shield body 5b to be inserted, and screw holes for screw fixation of the fixing screws 6b are made in the edge portion of the hole at specific positions. The rest is the same as the back cover 4 shown in FIG. 1 through FIG. 3.

The second shield body 5c is provided with holes for the fixing screws 6b and 6c to be inserted. After the back cover 4a is fixed to the chassis 2 with the fixing screws 6a, the second shield body 5c is connected to the first shield body 5b electrically and mechanically via the joint pieces 58b through screw fixation by which the fixing screws 6d are threaded into the screw holes made in the joint pieces 58b. The second shield body 5c is also connected to the back cover 4a electrically and mechanically through screw fixation by which the fixing screws 6b are threaded into the screw holes made in the back cover 4a.

In this embodiment, the same effects as the first embodiment can be achieved; moreover, because the second shield body 5c can be removed by unscrewing the fixing screws 6b and 6d, the tuner circuit 11 can be adjusted, repaired, or replaced without having to remove the back cover 4a. This configuration can therefore improve ease of maintenance. In addition, because the first shield body 5b can be also removed by unscrewing the fixing screws 6c, ease of maintenance of the device can be improved further.

Figure 11:
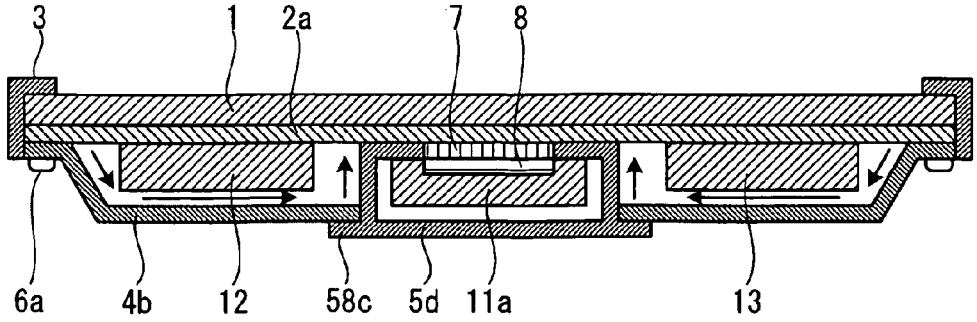
FIG. 11 is a cross section showing the configuration of a plasma display device according to a fourth embodiment of the invention.

A plasma display device according to a fourth embodiment of the invention will now be described. FIG. 11 is a cross section showing the configuration of the plasma display device according to the fourth embodiment of the invention. The plasma display device shown in FIG. 11 is different from the plasma display device shown in FIG. 1 through FIG. 3 in that the chassis 2, the shield body 5, the back cover 4, and the tuner circuit 11 are replaced by a chassis 2a, a shield body 5d, a back cover 4b, and a tuner circuit 11a, respectively, and the rest is the same as the plasma display device shown in FIG. 1 through FIG. 3. Hence, like components are labeled with like reference numerals and descriptions of such components are omitted.

A connector 7 used to electrically connect the tuner circuit 11a to other circuits, such as the signal processing circuit, is fixed to the chassis 2a shown in FIG. 11, and the chassis 2a is the same as the chassis 2 shown in FIG. 3 except that the screw holes used for screw fixation of the shield body 5d are omitted.

The shield body 5d comprises a metal body having conductivity, an electroplated molded article, or the like, and it serves as a second conducting member that covers the tuner circuit 11a. The tuner circuit 11a is the same as the tuner circuit 11 shown in FIG. 3 except that it is provided with a connected portion 8 comprising an electrical terminal or the like of a specific shape. The connected portion 8 is exposed from the shield body 5d through an opening made in the front surface of the shield body 5d. The shield body 5d, the tuner circuit 11a, and the connected portion 8 are formed as one unit, and can be therefore handled as a single module.

The back cover 4b is provided with a rectangular hole into which the side surface of the shield body 5d is fit, and the holes used for screw fixation of the shield body 5d are omitted. The rest is the same as the back cover 4 shown in FIG. 3. The shield body 5d is inserted to the chassis 2a side through this hole to fit the connected portion 8 in the connector 7. The tuner circuit 11 is thus electrically connected to the other circuits while the shield body 5d is fixed mechanically to the chassis 2a and to the back cover 4b.

In this instance, the front surface of the shield body 5d is adhered firmly to the chassis 2a and the connection pieces 58b of the shield body 5d are adhered firmly to the back cover 4b. It is thus possible to electrically connect the shield body 5d to the chassis 2a and to the back cover 4b.

In this embodiment, the same effects as the first embodiment can be achieved; moreover, the shield body 5d, the tuner circuit 11a, and the connected portion 8 can be attached to and detached from the chassis 2a as a single module without having to remove the back cover 4b. The tuner circuit 11 can be therefore adjusted, repaired, and replaced with ease. In addition, because no fixing screws and the like are used, the manufacturing steps can be simpler.

In this embodiment, the shield body 5d, the tuner circuit 11a, and the connected portion 8 are configured to form a single module that is attachable/detachable from the back surface of the plasma display device. However, the attachment/detachment direction is not particularly limited to this example, and various modifications are possible. For example, the module may be formed to be attachable/detachable from the bottom direction of the back surface of the plasma display device.

In the respective embodiments above, the tuner circuit is shielded using the single shield body 5. The invention, however, is not particularly limited to this example, and various modifications are possible. For example, circuits other than the tuner circuit may be shielded separately by shield bodies, or the tuner circuit together with another circuit or plural other circuits may be shielded by a single shield body.

As has been described, according to the invention, not only is it possible to reduce unwanted radiant noises released to the outside from the plasma display device, but it is also possible to reduce adverse influences to the internal circuits by using a simple configuration. The invention can be therefore suitably applied to a plasma display device using a plasma display driven at a high voltage.

The invention claimed is:

1. A plasma display device comprising:

a plasma display;

a supporting member having conductivity that supports the plasma display;

an electric circuit used to display a video on the plasma display, and including a driving circuit configured to drive the plasma display and a receiving circuit configured to receive a broadcast signal, the driving circuit including first and second driving circuits configured to drive the plasma display;

a first conducting member that covers the supporting member and the first and second driving circuits and does not cover the receiving circuit; and a second conducting member that covers the receiving circuit and shields the receiving circuit and does not cover the first and second driving circuits, the receiving circuit being fixed inside the second conducting member, wherein the second conducting member is electrically connected to the supporting member and to the first conducting member, and the first conducting member, the second conducting member, and the supporting member are arranged such that unwanted current from the first and second driving circuits flows through the first conducting member, then through the second conducting member, and then through the supporting member.

2. The plasma display device according to claim 1, wherein the electric circuit includes:

a digital circuit that processes a digital signal; and an analog circuit that processes an analog signal, and wherein:

the first conducting member covers the digital circuit; and the second conducting member covers the analog circuit.

3. The plasma display device according to claim 1, wherein the driving circuit includes:

a data electrode driving circuit configured to drive data electrodes of the plasma display, and wherein the first driving circuit is a scanning electrode driving circuit configured to drive scanning electrodes of the plasma display, and the second driving circuit is a sustaining electrode driving circuit configured to drive sustaining electrodes of the plasma display, and wherein:

the data electrode driving circuit, the scanning electrode driving circuit, and the sustaining electrode driving circuit are disposed in an outer peripheral portion of the supporting member; and the receiving circuit is disposed near a center of the supporting member.

4. The plasma display device according to claim 1, wherein:

the supporting member is connected to ground potential of the electric circuit.

5. The plasma display device according to claim 1, wherein:

the second conducting member is provided with a first joint portion used when joined to the first conducting member, and a second joint portion used when joined to the supporting member.

6. The plasma display device according to claim 5, wherein:

the second conducting member is fixed to the first conducting member through screw fixation via the first joint portion, and to the supporting member through screw fixation via the second joint portion.

7. The plasma display device according to claim 1, wherein:

the first conducting member is provided with an opening, and part of the second conducting member is exposed through the opening.

8. The plasma display device according to claim 7, wherein the second conducting member includes:

a first shield member connected to the supporting member; and a second shield member formed to be attachable to/detachable from the first shield member.

9. The plasma display device according to claim 7, wherein:

the second conducting member is formed to be removable from the supporting member and the first conducting member via the opening.

10. The plasma display device according to claim 9, wherein the second conducting member includes:

a first shield member allowed to be inserted in an interior of the first conducting member via the opening; and a second shield member formed to be attachable to/detachable from the first shield member.

11. The plasma display device according to claim 1, wherein:

the second conducting member is provided with a slit along a direction in which an unwanted current flows.

12. The plasma display device according to claim 1, wherein the receiving circuit is disposed between the first and second driving circuits, wherein the second conducting member includes:

a first shield plate disposed between the first driving circuit and the receiving circuit;

a second shield plate disposed between the second driving circuit and the receiving circuit;

a third shield plate disposed between one end of the first shield plate and one end of the second shield plate; and a fourth shield plate disposed between the other end of the first shield plate and the other end of the second shield plate, at least one of the third and fourth shield plates being provided with a slit near an end portion.

13. The plasma display device according to claim 12, wherein:

the first driving circuit includes a scanning electrode driving circuit that drives scanning electrodes of the plasma display; and the second driving circuit includes a sustaining electrode driving circuit that drives sustaining electrodes of the plasma display.

*14. A plasma display device comprising: a plasma display;*

*a supporting member having conductivity that supports the plasma display;*

*an electric circuit used to display a video on the plasma display, and including a driving circuit configured to drive the plasma display and a receiving circuit configured to receive a broadcast signal, the driving circuit including first and second driving circuits configured to drive the plasma display;*

*a first conducting member that covers the supporting member and the first and second driving circuits and covers the receiving circuit; and*

*a second conducting member that covers the receiving circuit and shields the receiving circuit and does not cover the first and second driving circuits, the receiving circuit being*

*fixed inside the second conducting member,*

*wherein the second conducting member is electrically connected to the supporting member and to the first conducting member, and*

*the first conducting member, the second conducting member, and the supporting member are arranged such that unwanted current from the first and second driving circuits flows through the first conducting member, then through the second conducting member, and then through the supporting member.*

* * * * *